United States Patent
Kn et al.

(10) Patent No.: US 8,587,320 B2
(45) Date of Patent: Nov. 19, 2013

(54) SYSTEM AND METHOD FOR TESTING A SECONDARY SERVO CONTROL CIRCUIT IN A REDUNDANT CONTROL CONFIGURATION

(75) Inventors: Dinesh Kumar Kn, Bangalore (IN); Nagaraja Sundaresh, Bangalore (IN); Karthik Giritharan, Bangalore (IN); Srinivasan Rajagopal, Bangalore (IN); Amol Kinage, Bangalore (IN); Rakesh Damodaran Nair, Bangalore (IN); Sai Krishnan Jagannathan, Bangalore (IN); Sunil M. Ingawale, Bangalore (IN); Sachin Kumar, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 424 days.

(21) Appl. No.: 12/942,115

(22) Filed: Nov. 9, 2010

(65) Prior Publication Data
US 2012/0112759 A1    May 10, 2012

(51) Int. Cl.
*G01R 31/00* (2006.01)
*G01R 31/08* (2006.01)

(52) U.S. Cl.
USPC ............................................. 324/500; 324/523

(58) Field of Classification Search
None
See application file for complete search history.

(56) References Cited

U.S. PATENT DOCUMENTS

| | | |
|---|---|---|
| 4,566,310 A | 1/1986 | Cohen et al. |
| 4,693,113 A | 9/1987 | McNennamy et al. |
| 4,844,110 A | 7/1989 | Paley |
| 5,197,328 A * | 3/1993 | Fitzgerald ..................... 73/168 |
| 5,339,782 A * | 8/1994 | Golzer et al. ................. 123/399 |
| 5,374,884 A | 12/1994 | Koren et al. |
| 5,566,092 A | 10/1996 | Wang et al. |
| 5,573,032 A | 11/1996 | Lenz et al. |
| 5,594,175 A | 1/1997 | Lyon et al. |
| 5,705,742 A | 1/1998 | Fox et al. |
| 5,721,477 A | 2/1998 | Sepehri et al. |
| 5,966,679 A | 10/1999 | Snowbarger et al. |

(Continued)

FOREIGN PATENT DOCUMENTS

| | | |
|---|---|---|
| JP | 5173641 A | 7/1993 |
| JP | 2007318107 A | 12/2007 |
| KR | 1020010061813 A | 7/2001 |

OTHER PUBLICATIONS

Notification of Transmittal of the International Search Report and the Written Opinion of the International Searching Authority, or the Declaration dated May 2, 2012 in connection with International Patent Application No. PCT/US2011/059264.

(Continued)

*Primary Examiner* — Vinh Nguyen

(57) ABSTRACT

A system, apparatus and method are provided for testing a secondary servo control circuit in a redundant control configuration. A first circuit is configured to receive a control signal and to control an attribute of an actuator based on the control signal using a first control input of the actuator. A second circuit is configured to test operation of an actuator circuit using a test signal. The actuator circuit includes at least part of the second circuit and a second control input of the actuator. The test signal is selected to avoid causing independent motion of the actuator. The actuator could be a dual coil servo valve, and the test signal could be a current (such as a DC current, an AC current, or a pulsed current) having a magnitude less than a bias current of the actuator.

20 Claims, 4 Drawing Sheets

(56) References Cited

U.S. PATENT DOCUMENTS

| | | | |
|---|---|---|---|
| 6,094,602 | A | 7/2000 | Schade, III |
| 6,138,810 | A | 10/2000 | Fujii et al. |
| 6,285,913 | B1 | 9/2001 | Hagglund |
| 6,286,532 | B1 | 9/2001 | van Nieuwstadt et al. |
| 6,330,525 | B1 | 12/2001 | Hays et al. |
| 6,453,261 | B2 | 9/2002 | Boger et al. |
| 6,466,893 | B1 | 10/2002 | Latwesen et al. |
| 6,517,029 | B1 | 2/2003 | Holmes |
| 6,745,084 | B2 | 6/2004 | Boger et al. |
| 6,745,107 | B1 | 6/2004 | Miller |
| 7,274,995 | B2 | 9/2007 | Zhan et al. |
| 7,286,945 | B2 | 10/2007 | Zhan et al. |
| 7,797,082 | B2 | 9/2010 | Srinivasan et al. |
| 2001/0037670 | A1 | 11/2001 | Boger et al. |
| 2002/0156541 | A1 | 10/2002 | Yutkowitz |
| 2004/0078168 | A1 | 4/2004 | Horch |
| 2004/0231641 | A1 | 11/2004 | Wind |
| 2007/0038333 | A1 | 2/2007 | Dadebo et al. |
| 2007/0288103 | A1 | 12/2007 | Choudhury et al. |
| 2009/0154311 | A1 | 6/2009 | Wiener |

OTHER PUBLICATIONS

M.A.A. Shoukat Choudhury, et al., "A Simple Test to Confirm Control Valve Stiction", IFAC World Congress 2005, Jul. 4-8, 2005, 6 pages.

Yoshiyuki Yamashita, "An Automatic Method for Detection of Valve Stiction in Process Control Loops", Control Eng. Practice 14 (2006), p. 503-510, available online May 5, 2005.

Liyu Cao, et al., "Stick-slip Friction Compensation for PID Position Control", Proceedings of the American Control Conference, Jun. 2000, p. 1078-1082.

M.A.A. Shoukat Choudhury et al., "A Data Driven Model for Valve Stiction", ADCHEM 2003, Jan. 11-14, 2004, Hong Kong, 6 pages.

Alexander Horch, "A Simple method for oscillation diagnosis in prcoess control loops", Proceedings of the 1999 IEEE International Conference on Control Applications, Aug. 22-27, 1999, p. 1284-1289.

M.A.A. Shoukat Choudhury, et al., "Automatic detection and quantification of stiction in control vales", Control Engineering Practice 14 (2006), p. 1395-1412.

M.A.A. Shoukat Choudhury, et al., "Modelling Valve Stiction", Control Engineering Practice, Jan. 11-14, 2004, 46 pages.

Tore Hagglund, "A Friction Compensator for Pneumatic Control Valves", Journal of Process Control, vol. 12, No. 8, Nov. 16, 2001, p. 897-904.

Ranganathan Srinivasan, et al., "Control Loop Performance Assessment. 1. A Qualitative Approach for Stiction Diagnosis," Ind. Eng. Chem. Res., vol. 44, No. 17, Jul. 12, 2005, p. 6708-6718.

Ranganathan Srinivasan, et al., "Control Loop Performance Assessment. 2. Hammerstein Model Approach for Stiction Diagnosis," Ind. Eng. Chem. Res., vol. 44, No. 17, Jul. 12, 2005, p. 6719-6728.

H. Olsson, et al., "Friction Models and Friction Compensation", European Journal of Control, vol. 4, Nov. 28, 1997, p. 37 pages.

\* cited by examiner

SYSTEM AND METHOD FOR TESTING A SECONDARY SERVO CONTROL CIRCUIT IN A REDUNDANT CONTROL CONFIGURATION

TECHNICAL FIELD

This disclosure relates generally to process control systems. More specifically, this disclosure relates to a system, apparatus, and method for testing a secondary servo control circuit in a redundant control configuration.

BACKGROUND

Processing facilities are often managed using process control systems. Example processing facilities include (but are not limited to) manufacturing plants, chemical plants, crude oil refineries, ore processing plants, and paper or pulp manufacturing and processing plants. Among other operations, process control systems typically manage the use of motors, valves, and other industrial equipment in the processing facilities.

In conventional process control systems, process controllers are often used to control the operation of the industrial equipment in the processing facilities. The process controllers could, for example, monitor the operation of the industrial equipment, provide control signals to the industrial equipment, and generate alarms and notifications when malfunctions are detected. As an example, a process control system may provide redundant servo controllers to ensure continued control of critical, high availability subsystems in the case of a failure in a servo system. Failures may include malfunctioning servo coils, field cables, drive circuits, or other servo control components.

When a failure occurs, the process control system may sense the failure in one of the two circuits providing redundant control of the servo system, isolate the failed circuit, and switch control of the servo system to the other control circuit of the redundant pair automatically. Central process controllers and/or local process controllers may provide the failure sensing and control switchover/failover functionality.

SUMMARY

This disclosure provides a system, apparatus, and method for testing (or monitoring) a secondary servo control circuit in a redundant control configuration.

In a first embodiment, a method includes, in a primary control circuit, receiving a control signal and controlling an attribute of an actuator based on the control signal using a first control input of the actuator. The method further includes, in a secondary control circuit, testing operation of an actuator circuit using a test signal. The actuator circuit includes at least part of the secondary control circuit and a second control input of the actuator. The test signal is selected to avoid causing independent motion of the actuator.

In a second embodiment, an apparatus includes a first circuit and a second circuit. The first circuit is configured to receive a control signal and to control an attribute of an actuator based on the control signal using a first control input of the actuator. The second circuit is configured to test operation of an actuator circuit using a test signal. The actuator circuit includes at least part of the second circuit and a second control input of the actuator. The test signal is selected to avoid causing independent motion of the actuator.

In a third embodiment, a system includes an actuator, a first circuit, and a second circuit. The actuator comprises first and second control inputs. The first circuit is configured to receive a control signal and control an attribute of the actuator based on the control signal using the first control input of the actuator. The second circuit is configured to test operation of an actuator circuit using a test signal. The actuator circuit includes at least part of the second circuit and the second control input of the actuator. The test signal is selected to avoid causing independent motion of the actuator.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
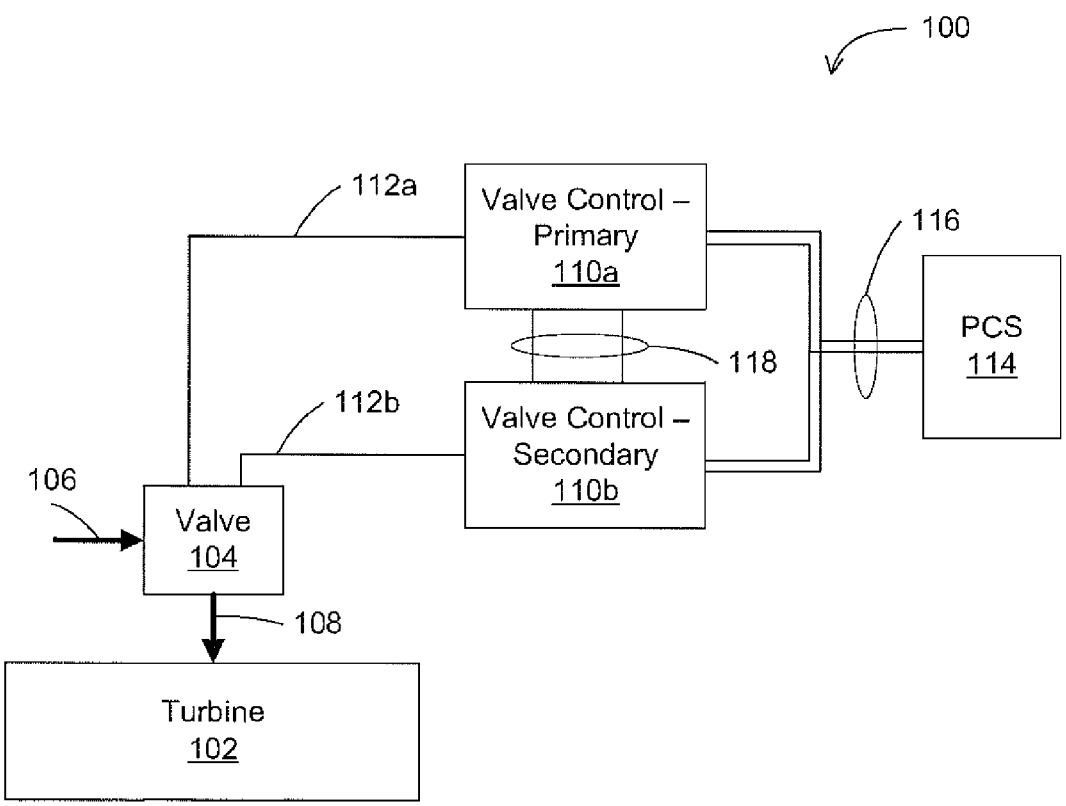
FIG. 1 illustrates an example portion of a process control system according to this disclosure.

FIG. 1 illustrates an example portion of a process control system 100 according to this disclosure. The embodiment of the system 100 shown in FIG. 1 is for illustration only. Other embodiments of the system 100 may be used without departing from the scope of this disclosure.

The portion of the process control system 100 shown in FIG. 1 includes a turbine 102 and a valve 104. The valve 104 may control a supply of fuel, cooling fluid, or some other fluid or gas used for operation of the turbine 102. The valve 104 receives a supply of the gas or fluid via an input 106 and provides a controlled amount of the gas or fluid to the turbine 102 via an output 108.

Valve control circuits (VCCs) 110a and 110b, which control the valve 104 via control links (or cables) 112a and 112b, respectively, provide redundant control of the valve 104. The valve 104 is a dual coil servo valve. Either coil is capable of controlling the position of the valve 104 on its own, or the coils are operable to control the position of the valve 104 cooperatively. By providing redundant VCCs 110a and 110b, redundant control links 112a and 112b, and a dual coil servo valve 104, the system 100 reduces or eliminates the possibility of loss of proper control of the valve 104 due to failure of a single component, which could result in damage to or shutdown of the turbine 102.

The VCCs 110a and 110b receive control signals from a process control system (PCS) 114 via a communication link 116. To reduce or eliminate the possibility of a single point of failure, the communication link 116 comprises a redundant pair of links between the PCS 114 and the VCCs 110a and 110b. In other embodiments, the communication link 116 may comprise single separate links between the PCS 114 and each of the VCCs 110a and 110b. In still other embodiments, the communication link 116 may be a bus, network, or other communication link.

The VCCs 110a and 110b also communicate with each other via a communication link 118. As will be explained in more detail with reference to FIG. 2, the VCCs 110a and 110b may exchange signals via the communication link 118. This can be done to cause a control changeover in the event of a failure in the primary control circuit. It can also be done to allow one control circuit to inhibit the other control circuit from controlling the valve 104.

In some systems, the PCS 114 sends a desired setpoint for the valve 104 to both VCC 110a and VCC 110b. Each VCC drives half of the current (or another specified share of full current). A failure in either set of circuits, cables, or coils may result in the remaining, properly operating circuit providing full control current to the valve 104. In this system, proper operation of both sets of circuits, cables, and coils may be monitored during normal operation because current may always be provided by each set of control circuits, cables, and coils.

In other systems, one VCC drives the full current required to position the valve 104 at a position commanded by the PCS 114, while the other VCC provides no current to the valve 104 or otherwise remains in standby or inhibit mode. In these systems, a failure in the control circuit, cable, or coil of the active VCC results in the other VCC assuming control of the valve 104. However, while the backup VCC is in standby, determining a functional status of the backup control circuit, cable, and coil may be difficult.

As described in more detail with reference to FIG. 3, the process control system 100 provides control of the valve 104 from, for example, the VCC 110a, while the VCC 110b generates a diagnostic current or other test signal to test its control circuit, cable, and coil without significantly affecting control of the valve 104 by the VCC 110a. In this way, a functional status of the backup control circuit, cable, and coil of the VCC 110b may be determined.

While the valve 104 is shown in FIG. 1 as a control element for a turbine 102, in other embodiments a control system may be employed to control a process control actuator for use with a furnace, mixing system, or other process component requiring highly reliable control of a manipulated variable. Further, while the valve 104 in this example is a dual coil servo valve, in other embodiments a control system may use any other process control actuator having two or more control inputs. In addition, while the system 100 in this example controls a position of the valve 104, a control system may be used to control other attributes of an actuator, such as rotational velocity of a motor.

Figure 2:
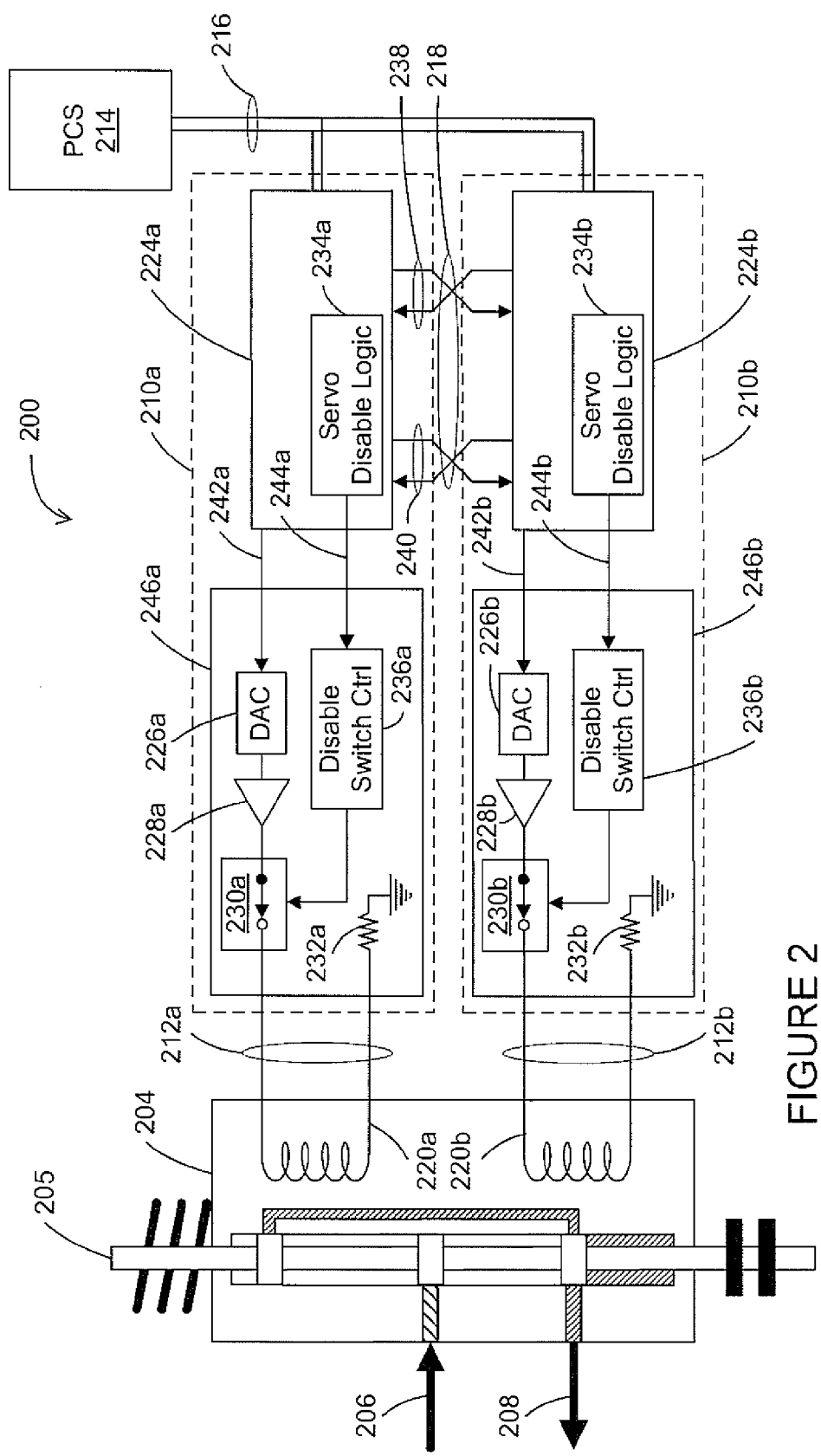
FIG. 2 illustrates an example dual coil servo valve control system according to this disclosure.

FIG. 2 illustrates an example dual coil servo valve control system 200 according to this disclosure. The embodiment of the valve control system 200 shown in FIG. 2 is for illustration only. Other embodiments of the valve control system 200 may be used without departing from the scope of this disclosure.

In this example, a dual coil servo valve 204 includes a coil 220a and a coil 220b, which can be operated together or separately to control a position of a valve element 205. The valve element 205 regulates an amount of a fluid or gas passing from an input 206 of the valve 204 to an output 208 of the valve 204.

A valve control circuit (VCC) 210a controls the coil 220a via a control link 212a. Similarly, a VCC 210b controls the coil 220b via a control link 212b. The VCC 210a includes a kernel board 224a and an application board 246a. Similarly, the VCC 210b includes a kernel board 224b and an application board 246b. In some embodiments, the kernel boards 224a and 224b include primarily digital circuitry and the application boards 246a and 246b include primarily analog circuitry. In other embodiments, the kernel boards 224a and 224b and the application boards 246a and 246b may include other proportions of digital and analog circuitry.

The VCC 210a and VCC 210b are controlled via a communication link 216 by a process control system (PCS) 214. The kernel boards 224a and 224b receive commands and provide responses to the PCS 214 using a communication protocol appropriate to the communication link 216. The kernel boards 224a and 224b respectively provide control signals for the coils 220a and 220b on control links 242a and 242b. The kernel boards 224a and 224b include servo disable logic circuits 234a and 234b, respectively, which provide disable signals for the coils 220a and 220b on control links 244a and 244b.

The kernel boards 224a and 224b also communicate directly with each other using a communication link 218. The communication link 218 includes a backup request link 238 and an inhibit command link 240. The backup request link 238 can transport two unidirectional signals, one from each of the VCCs 210a and 210b to the other. Using the backup request link 238, if VCC 210a (for example) is acting as a primary controller, it is operable to signal the VCC 210b to take over as primary controller. In some circumstances, the VCC 210a might send the backup request signal upon internally sensing a failure in its circuits or program execution. In other circumstances, the VCC 210a might send the backup request signal in response to a command from the PCS 214, where the PCS 214 has identified a failure in the operation of the VCC 210a or has received an indication from a service technician that service is to be performed on the VCC 210a.

The inhibit command link 240 can also transport two unidirectional signals, one from each of the VCCs 210a and 210b to the other. Either VCC may command the other VCC to inhibit (or disable) its servo control output to the valve 204. The VCCs 210a and 210b disable their servo outputs by disconnecting their circuits from their associated respective coils 220a and 220b in the valve 204. Additionally or alternatively, a VCC may inhibit its circuit in response to a command from the PCS 214. The VCCs 210a and 210b include servo disable logic 234a and 234b, respectively, which operate to inhibit servo control by the application boards 246a and 246b via the control links 244a and 244b, respectively.

The kernel board 224a can generate a control signal for the coil 220a on the control link 242a based upon commands received from the PCS 214 and logic circuits internal to the kernel board 224a. The application board 246a includes a digital-to-analog converter 226 that receives a control signal from the kernel board 224a and converts the control signal to an analog control voltage. The analog control voltage is input to a current source 228a, which provides to the coil 220a a control current that is based upon the analog control voltage. The control current passes through an inhibit switch 230a, the control link 212a, the coil 220a, and a sense resistance 232a to ground. A similar circuit is provided in the application board 246b with like-numbered elements to pass a control current through the coil 220b.

In one aspect of operation, the PCS 214 can command the VCC 210a to operate as a primary control circuit for the valve 204 and the VCC 210b to operate as a secondary (or backup) control circuit for the valve 204. Subsequently, the PCS 214 can issue a command to position the valve 204 at a specified setting. However, only the VCC 210a may perform the command by producing a current for the coil 220a to move a position of the valve element 205, thereby achieving a desired setting. The VCC 210b can store the command for use if the VCC 210b is requested to assume primary control of the valve 204.

While the VCC 210a is acting as the primary controller for the valve 204, the VCC 210b produces a diagnostic current or other test (or monitor) signal from the current source 228b. The test signal passes through circuit elements of the application board 246b, the control link 212b, the coil 220b, and the sense resistance 232b (collectively, the "coil circuit" or the "actuator circuit"). The application board 246b makes two measurements to monitor the coil circuit for failure.

First, the application board 246b senses a voltage produced across the sense resistance 232b by the test signal. If no voltage or an incorrect voltage is produced across the sense resistance 232b, the application board 246b can determine that a failure has occurred in one or more elements of the coil circuit. Additionally, the application board 246b senses a voltage produced across the coil 220b, control link 212b and sense resistance 232b by the test signal. If no voltage or an incorrect voltage is produced across the coil 220b, control link 212b and sense resistance 232b, the application board 246b can determine that a failure has occurred in one or more elements of the coil circuit. In some embodiments, one or the other of these two measurements may be made by the application board 246b. If either of the measurements indicates a failure in the coil circuit, the VCC 210b can then report this failure condition to the PCS 214.

While the voltages measured by the application board 246b indicate that the coil circuit is operating properly, the VCC 210b is operable to receive a command to assume primary control of the valve 204. The command may come from the VCC 210a via the backup request link 238 or from the PCS 214 via the communication link 216. If the command comes from the VCC 210a and indicates a failure in the VCC 210a, the VCC 210b may send an inhibit signal on the inhibit command link 240 to disable the output of the VCC 210a.

By operating the secondary VCC to generate a test signal, proper operation of the secondary controller coil circuit may be confirmed. Furthermore, electrical stress on the coil circuit of the secondary VCC is reduced, relative to a system in which both VCCs operate together to drive the coils 220a and 220b to position the valve 204. The PCS 214 may periodically switch primary control of the valve 204 from the VCC 210a to the VCC 210b and back again in order to equalize electrical stress on the coil circuits of the VCC 210a and the VCC 210b, which may result in better long term reliability of the coil circuits.

The magnitude of the diagnostic current generated by the current source 228b is selected to be less than a bias current required by the coil 220b so that the diagnostic current does not produce movement in the valve element 205. However, the magnitude of the diagnostic current is also selected to be greater than a noise level of current in the coil circuit so that the diagnostic current may be reliably sensed above the noise level. Typically, the magnitude of the diagnostic current is selected to be as small as possible while being large enough to be reliably detected above any noise present in the coil circuit. In some embodiments, the VCC performs a calibration procedure at configuration, power-up or upon command from the PCS 214 to select a diagnostic current magnitude that is appropriate to the operating conditions of the coil circuit.

The diagnostic current may be a DC current, an AC current, a pulse current, or any other appropriate continuous or varying current. The diagnostic current through the coil 220b, while not producing movement of the valve 204 on its own, may act to augment or counteract forces applied to the valve element 205 by the coil 220a. Any such force may be corrected for as a disturbance variable by a proportional-integral-derivative or other feedback control mechanism employed by the VCC 210a in driving the valve 204 to the setting commanded by the PCS 214.

Where a continuous diagnostic current is used to detect a failure in the coil circuit, the VCC 210b may change the diagnostic current to a pulsed current once a failure has been detected. This change may be made where a continuous diagnostic current applied to a failed coil circuit would generate a voltage build-up in the coil circuit across the failed circuit element. The voltage build-up may cause damage to other circuit elements or may be dangerous to service technicians or other operations personnel.

Figure 3:
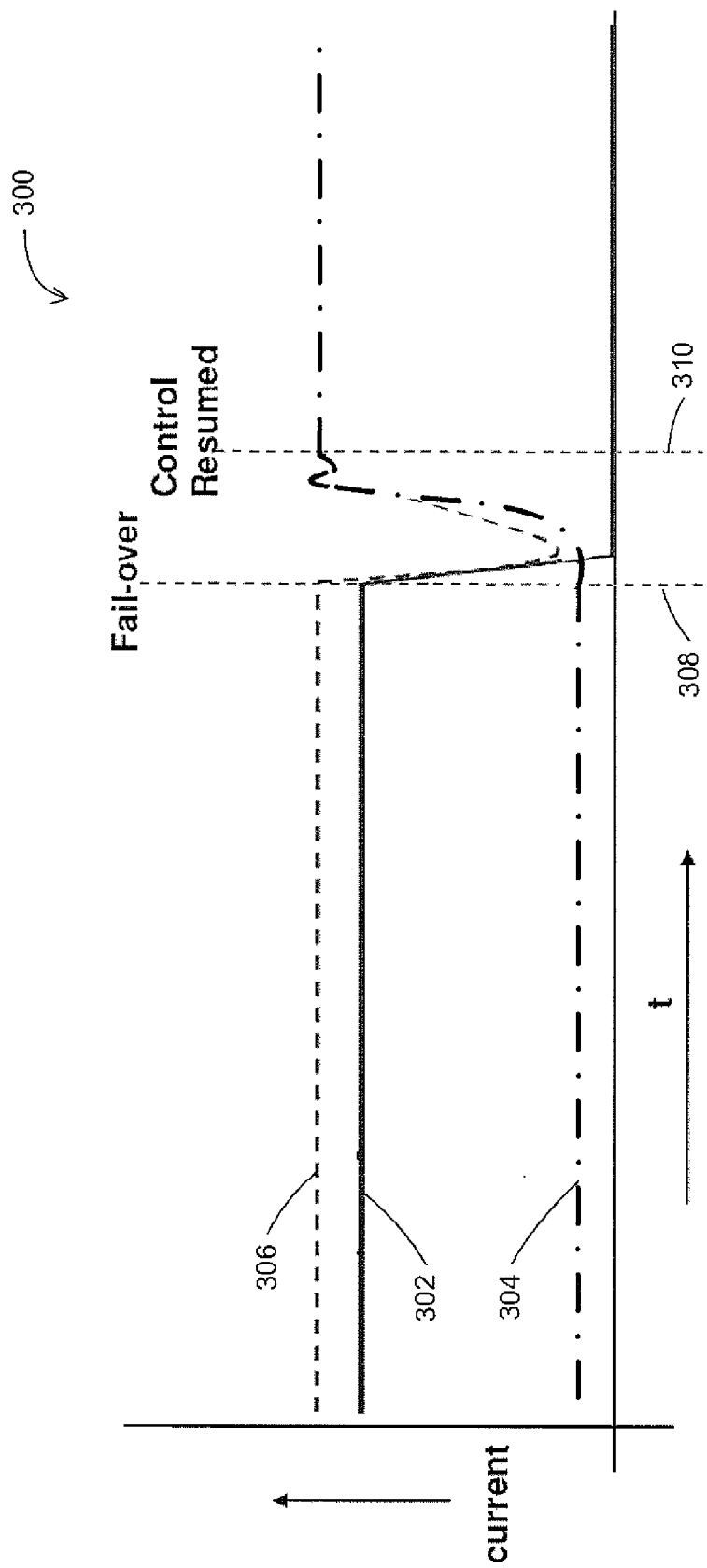
FIG. 3 illustrates an example graph of coil current versus time during changeover from a primary controller to a secondary controller according to this disclosure.

FIG. 3 illustrates an example graph 300 of coil current versus time during changeover from a primary controller to a secondary controller according to this disclosure. For clarity, the graph 300 is described with reference to the dual coil servo valve control system 200 and the example scenario in which the VCC 210a operates as a primary controller and the VCC 210b operates as a secondary controller.

A first trace 302 shows a current from the primary controller VCC 210a for controlling a position of the valve 204. At time 308, the VCC 210a fails, and the current supplied to the coil 220a drops to zero. Prior to the time 308, the secondary controller VCC 210b generates a diagnostic current through the coil 220b shown by a second trace 304. A third trace 306 shows a combined current through the coils 220a and 220b, which results in a commanded position of the valve 204. As may be seen from the graph 300, because of the effect of the diagnostic current 304 through the coil 220b, the VCC 210a generates a lower current through the coil 220a than would otherwise be required to position the valve 204 at the commanded position.

When the failure of the VCC 210a is sensed at time 308, a process to changeover primary control of the valve 204 to the VCC 210b is commenced. By time 310, the changeover of control is complete. During the changeover, the VCC 210b increases the current through the coil 220b to the level of the combined current 306 prior to time 308 to drive the valve 204 to the commanded position. Between time 308 and time 310 (after the current from the VCC 210a falls off and while the current from the VCC 210b is rising to the appropriate level), the combined current 306 decreases before returning to the appropriate level at time 310. In a properly designed system, this transient deviation in the combined current 306 does not adversely affect operation of the turbine 102 or other process component with which the valve 204 is associated.

Figure 4:
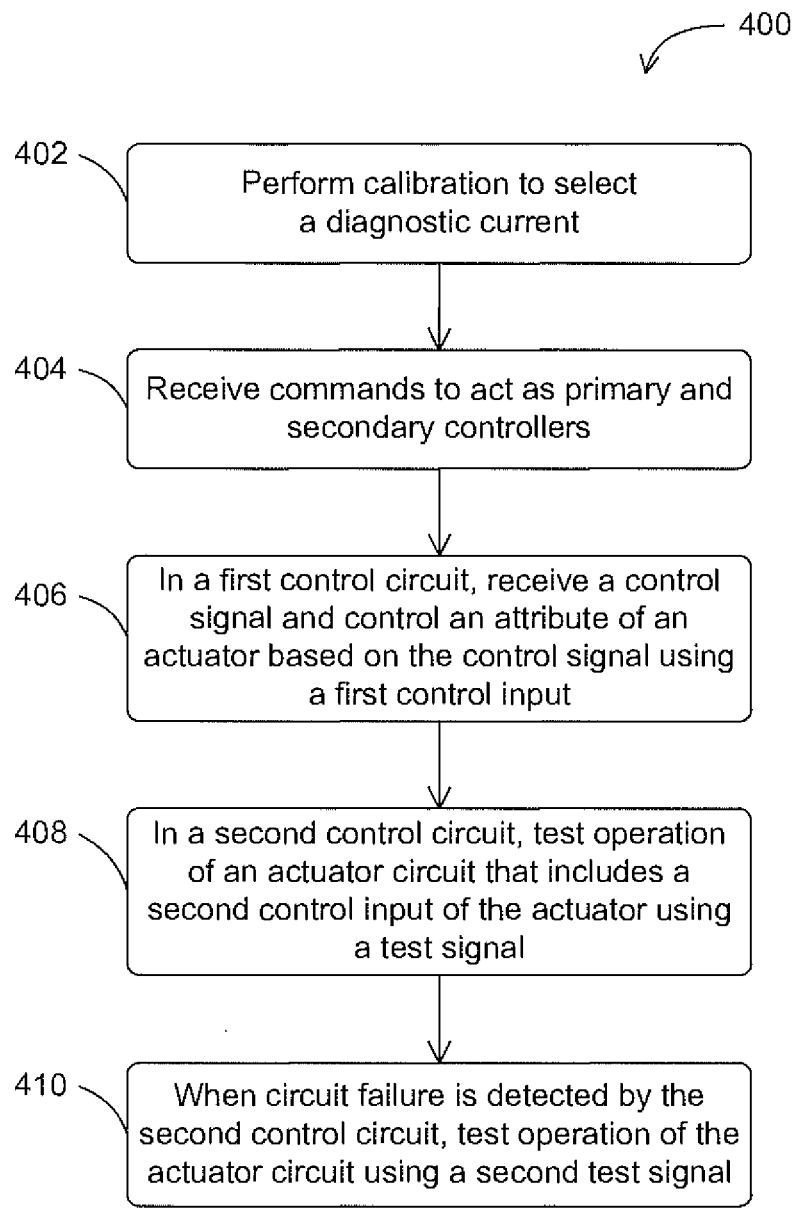
FIG. 4 illustrates an example process for testing a secondary servo control circuit in a redundant control configuration according to this disclosure.

FIG. 4 illustrates an example process 400 for testing a secondary servo control circuit in a redundant control configuration according to this disclosure. For ease of explanation, the process 400 is described with reference to the system 200 of FIG. 2. The same or similar process 400 could be used with other systems, such as the system 100 of FIG. 1.

In step 402, the VCCs 210a and 210b perform a calibration procedure at configuration, power-up or upon command from the PCS 214 to select diagnostic current magnitudes appropriate to the operating conditions of their respective actuator circuits. The VCC 210a may select a magnitude that is below a bias current of the coil 220a while also being above a noise level of the actuator circuit formed by the application board 246a, the control link 212a, the coil 220a, and the sense resistance 232a.

In step 404, the VCCs 210a and 210b receive one or more configuration commands from the PCS 214. The commands may instruct the VCC 210a to act as a primary control circuit for the valve 204 and the VCC 210b to act as a secondary control circuit for the valve 204. Based upon the commands, the VCC 210b may begin testing its actuator circuit using techniques such as those described above, and the VCC 210a may begin performing servo control of a position of the valve 204.

In step 406, the VCC 210a receives a control signal from the PCS 214 and controls a position of the valve element 205 based on the control signal. Concurrently, in step 408, the VCC 210b is testing operation of its actuator circuit using a test signal (such as a diagnostic current) with a magnitude as selected in step 402. The test signal may be a DC current, an AC current, a pulsed current, or other suitable signal.

If the VCC 210b detects a failure in its actuator circuit in step 408, the VCC 210b may optionally resume testing the failed circuit using a second test signal at step 410, where the second test signal is different from the test signal used in step 408. In an actuator circuit that has failed as an open circuit, applying a continuous current to the failed circuit could cause a voltage to build up across the two branches of the open circuit. Where the test signal used in step 408 is a continuous current, in step 410 the VCC 210b may use a test signal such as a pulsed current. This can allow voltage built up during the pulsed current to dissipate during periods when the diagnostic current is off.

In some embodiments, some or all of the VCCs 110a and 110b, the kernel boards 224a and 224b, and the application boards 246a and 246b may be implemented using a processing device and a memory that includes program code. In other embodiments, some or all of the VCCs 110a and 110b, the kernel boards 224a and 224b, and the application boards 246a and 246b may be implemented with fixed or programmable logic configured to perform the methods described above. Kernel board 224a and application board 246a (and similarly kernel board 224b and application board 246b) may be implemented as single printed circuit board (PCB) or as two separate PCBs.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. Terms like "receive" and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   in a primary control circuit, receiving a control signal and controlling an attribute of an actuator based on the control signal using a first control input of the actuator; and
   in a secondary control circuit, testing an operation of an actuator circuit using a test signal, the actuator circuit comprising at least part of the secondary control circuit and a second control input of the actuator, wherein the test signal is selected to avoid causing independent motion of the actuator.

2. The method of claim 1, wherein the test signal is further selected to be above a noise level in the actuator circuit.

3. The method of claim 1, wherein the actuator is a dual coil servo valve.

4. The method of claim 1, wherein the test signal is a current having a magnitude less than a bias current of the actuator.

5. The method of claim 4, further comprising:
   measuring a voltage produced across a resistance by the current; and
   detecting a failure in the actuator circuit based on the measured voltage.

6. The method of claim 4, wherein the current is one of a DC current, an AC current, and a pulsed current.

7. The method of claim 4, wherein:
   the test signal is a continuous current; and
   the method further comprises, after detecting a failure in the actuator circuit, testing the operation of the actuator circuit using a second test signal comprising a pulsed current.

8. An apparatus comprising:
   a first circuit configured to receive a control signal and to control an attribute of an actuator based on the control signal using a first control input of the actuator; and
   a second circuit configured to test an operation of an actuator circuit using a test signal, the actuator circuit comprising at least part of the second circuit and a second control input of the actuator, wherein the test signal is selected to avoid causing independent motion of the actuator.

9. The apparatus of claim 8, wherein the second circuit is further configured to select the test signal to be above a noise level in the actuator circuit.

10. The apparatus of claim 8, wherein the test signal is a current having a magnitude less than a bias current of the actuator.

11. The apparatus of claim 10, wherein the second circuit is further configured to:
    measure a voltage produced across a resistance by the current; and
    detect a failure in the actuator circuit based on the measured voltage.

12. The apparatus of claim 10, wherein the current is one of a DC current, an AC current, and a pulsed current.

13. The apparatus of claim 10, wherein:
    the test signal is a continuous current; and
    the second circuit is further configured, after detecting a failure in the actuator circuit, to test the operation of the actuator circuit using a second test signal comprising a pulsed current.

14. A system comprising:

an actuator comprising first and second control inputs;

a first circuit configured to receive a control signal and to control an attribute of the actuator based on the control signal using the first control input of the actuator; and a second circuit configured to test an operation of an actuator circuit using a test signal, the actuator circuit comprising at least part of the second circuit and the second control input of the actuator, wherein the test signal is selected to avoid causing independent motion of the actuator.

15. The system of claim 14, wherein the second circuit is further configured to select the test signal to be above a noise level in the actuator circuit.

16. The system of claim 14, wherein the actuator is a dual coil servo valve.

17. The system of claim 14, wherein the test signal is a current having a magnitude less than a bias current of the actuator.

18. The system of claim 17, wherein the second circuit is further configured to:

measure a voltage produced across a resistance by the current; and detect a failure in the actuator circuit based on the measured voltage.

19. The system of claim 17, wherein the current is one of a DC current, an AC current, and a pulsed current.

20. The system of claim 17, wherein:

the test signal is a continuous current; and the second circuit is further configured, after detecting a failure in the actuator circuit, to test the operation of the actuator circuit using a second test signal comprising a pulsed current.

* * * * *